United States Patent
Wu et al.

(10) Patent No.: US 7,319,618 B2
(45) Date of Patent: Jan. 15, 2008

(54) LOW-K SPACER STRUCTURE FOR FLASH MEMORY

(75) Inventors: Chu-Ching Wu, Hsinchu (TW); Cheng-Ming Yih, Hsinchu (TW)

(73) Assignee: Macronic International Co., Ltd., Hsinchu (TW)

( * ) Notice: Subject to any disclaimer, the term of this patent is extended or adjusted under 35 U.S.C. 154(b) by 263 days.

(21) Appl. No.: 11/204,537

(22) Filed: Aug. 16, 2005

(65) Prior Publication Data

US 2007/0042544 A1 Feb. 22, 2007

(51) Int. Cl.
*G11C 11/34* (2006.01)

(52) U.S. Cl. ............. 365/185.26; 257/315; 365/185.05

(58) Field of Classification Search ........... 365/185.26, 365/185.05, 185.18, 185.27; 257/315
See application file for complete search history.

(56) References Cited

U.S. PATENT DOCUMENTS

| | | | |
|---|---|---|---|
| 6,107,667 A * | 8/2000 | An et al. .................... | 257/408 |
| 6,348,385 B1 | 2/2002 | Cha et al. | |
| 6,613,637 B1 | 9/2003 | Lee et al. | |
| 2003/0038305 A1 | 2/2003 | Wasshuber | |
| 2004/0256657 A1 * | 12/2004 | Hung et al. ................. | 257/315 |
| 2006/0033145 A1 * | 2/2006 | Kakoschke et al. ......... | 257/315 |
| 2006/0102948 A1 * | 5/2006 | Chang et al. ............... | 257/315 |

* cited by examiner

*Primary Examiner*—Anh Phung
*Assistant Examiner*—Hien Nguyen
(74) *Attorney, Agent, or Firm*—Akin Gump Strauss Hauer & Feld LLP

(57) ABSTRACT

A flash memory cell includes a silicon substrate having a main surface, a source region in a portion of the silicon substrate proximate the main surface and a drain region in a portion of the silicon substrate proximate the main surface. The drain region is spaced apart from the source region. The memory cell includes a first dielectric layer formed on the main surface, a floating gate disposed above the first dielectric layer, an inter-gate dielectric layer disposed above the floating gate, a control gate disposed above the inter-gate dielectric layer, a second dielectric layer and a low-k dielectric spacer layer disposed on the second dielectric layer. The first dielectric layer covers a portion of the main surface between the source and the drain. The second dielectric layer surrounds outer portions of the first dielectric layer, the control gate, the inter-gate dielectric layer and the floating gate.

8 Claims, 6 Drawing Sheets

LOW-K SPACER STRUCTURE FOR FLASH MEMORY

BACKGROUND OF THE INVENTION

The present invention relates to a flash memory device and a method for manufacturing a flash memory device, and more particularly, to a flash memory device having a low-k dielectric spacer and a method for manufacturing a flash memory device having a low-k dielectric spacer.

"Flash memory" is a special type of electrically erasable programmable read only memory (EEPROM) that is known in the art. A normal EEPROM only allows one location at a time to be erased or written, meaning that flash memory can operate at higher effective speeds when the system uses it to read and write to different locations at the same time. All types of flash memory and EEPROM wear out after a certain number of erase operations, due to wear on the insulating oxide layer around the charge storage mechanism used to store data. Flash memory is non-volatile, which means that it stores information on a silicon chip in a way that does not need power to maintain the information in the chip. In addition, flash memory offers fast read access times and solid-state shock resistance.

Flash memory typically stores information in an array of transistors, commonly referred to as "cells," each of which traditionally stores one bit of information. Flash memory is based on the Floating-Gate Avalanche-Injection Metal Oxide Semiconductor (FAMOS) transistor which is essentially an n-type Metal Oxide Semiconductor (NMOS) transistor with an additional floating conductor "suspended" by insulating materials between the gate and source/drain terminals.

FIG. 1 is a cross sectional view of a conventional flash memory cell 500. The conventional floating gate flash memory cell 500 includes an n$^+$ type source 504, a p type channel 505, an n$^+$ type drain 512 and a p-type substrate 502. A floating gate 506 is sandwiched between an insulating dielectric layer 510 and thin tunnel oxide layer 514 over the channel 505. The floating gate 506 provides the memory storage element for the flash memory cell 500 and is electrically insulated from other elements of the memory cell 500 by the thin tunnel oxide layer 514 and the insulating dielectric layer 510. Control gate 508 is located on top of the insulating dielectric 510 and is positioned over the floating gate 506. The floating gate 506 is electrically isolated from the control gate 508 by the insulating layer 510 such as a layer of silicon dioxide (SiO$_2$). The conventional flash memory cell 500 shown is basically an n-channel transistor with the addition of a floating gate 506. Electrical "access" or coupling to the floating gate 506 takes place only through a capacitor network of surrounding SiO$_2$ layers and source 504, drain 512, channel 505, and control gate 508. Any charge present on the floating gate 506 is retained due to the inherent Si—SiO$_2$ energy barrier height, thereby creating a non-volatile memory.

Typically, the structure of the conventional flash memory cell 500 includes a thin tunneling oxide layer 514 on the order of about 100 angstroms (Å), an abrupt drain junction, a graded source junction, oxide-nitride-oxide (ONO) interpoly oxide and a short electrical channel length on the order of about 0.3 microns or micrometers (μm). Because the only electrical connection to the floating gate 506 is through capacitance, the flash memory cell 500 can be thought of as a linear "capacitor network" with an n-channel transistor attached thereto. The total capacitance of the cell 500 is approximately equal to the additive capacitance of the network. Coupling ratio terms for the flash memory cell 500, which are defined as the ratio of terminal voltage coupled to the floating gate, are typically defined as follows: control gate coupling ratio (GCR), drain coupling ratio (DCR) and source coupling ratio (SCR).

Programming a flash memory cell 500 means that charge (i.e., electrons) is added to the floating gate 506. A high drain to source bias voltage is applied, along with a high control gate voltage V$_g$. The control gate voltage V$_g$ inverts the channel 505, while the drain bias accelerates electrons toward the drain 512. In the process of crossing the channel 505, some electrons will collide with the silicon lattice and become redirected toward the Si—SiO$_2$ interface. With the aid of the field produced by the gate voltage V$_g$ some of the electrons travel across the thin oxide layer 514 and become added to the floating gate 506. After programming is completed the electrons added to the floating gate 506 increase the cell's threshold voltage. Programming is a selectively performed on each individual cell 500 in an array of cells 500.

Reading a flash memory cell 500 is performed using a sense amplifier (not shown). For cells 500 that have been programmed, the turn-on voltage Vt of cells is increased by the increased charge on the floating gate 500. By applying a control gate voltage V$_g$ and monitoring the drain current, differences between a cell with charge and a cell without charge on the respective floating gates can be determined. A sense amplifier compares cell drain current with that of a reference cell such as a flash memory cell 500 which is programmed to the reference level during a manufacturing test. An erased memory cell 500 has more cell current than the reference cell and therefore is a logical "1" whereas a programmed memory cell 500 draws less current than the reference cell and is a logical "0."

Erasing a flash memory cell 500 means that electrons (charge) are removed from the floating gate 506. Erasing flash memory is performed by applying electrical voltages to many cells at once so that the cells 500 are erased in a "flash." A typical erase operation in a flash memory cell 500 may be performed by applying a positive voltage to the source 504, a negative or a ground voltage to the control gate 508 and holding substrate 502 of the flash memory cells 500 at ground potential. The drain 512 is allowed to "float." Under these conditions, a high electric field is present between the floating gate 506 and the source 504. The source junction experiences a gated-diode condition during erase and electrons that manage to tunnel through the first few angstroms of the SiO$_2$ of the tunnel oxide layer 514 are then swept into the source 504. After the erase operation has been completed, electrons have been removed from the floating gate 506 thereby reducing the cell threshold voltage Vt. While programming is selective to each individual flash memory cell 500, an erase operation typically includes many flash memory cells 500 in an array being erased simultaneously.

As the cell sizes for flash memory 500 continue to be reduced, the capacitance measured between the gate 506 and the drain 512 increases thereby resulting in a reduction of GCR.

It is desirable to provide a flash memory cell that can be reduced in size relative to conventional flash memory cells while not reducing GCR and achieving good performance and reliability. It is desirable to provide to a flash memory device having a low-k (dielectric value) spacer and a method for manufacturing such a flash memory device having a low-k dielectric spacer.

BRIEF SUMMARY OF THE INVENTION

Briefly stated, the present invention comprises a flash memory cell that includes a silicon substrate having a main surface, a source region in a portion of the silicon substrate proximate the main surface and a drain region in a portion of the silicon substrate proximate the main surface. The drain region is spaced apart from the source region. The flash memory cell includes a first dielectric layer formed on the main surface, a floating gate disposed above the first dielectric layer, an inter-gate dielectric layer disposed above the floating gate, a control gate disposed above the inter-gate dielectric layer, a second dielectric layer and a low-k dielectric spacer layer disposed on the second dielectric layer. The first dielectric layer covers a portion of the main surface between the source and the drain. The second dielectric layer surrounds outer portions of the first dielectric layer, the control gate, the inter-gate dielectric layer and the floating gate.

In another aspect, the present invention comprises a method of forming a flash memory cell. A silicon substrate having a main surface is provided. A first dielectric layer is formed on the main surface of the substrate. A floating gate is formed above the first dielectric layer, and an inter-gate dielectric layer is formed above the floating gate. A control gate is formed above the inter-gate dielectric layer. Portions of the control gate, the inter-gate dielectric layer, the floating gate and the first dielectric layer are removed. A source region is formed in a portion of the silicon substrate proximate the main surface. A drain region is formed in a portion of the silicon substrate proximate the main surface. The drain is spaced apart from the source region. A second dielectric layer is formed surrounding outer portions of the first dielectric layer, the control gate, the inter-gate dielectric layer and the floating gate. A low-k dielectric spacer layer is formed on the second dielectric layer.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown. In the drawings.

DETAILED DESCRIPTION OF THE INVENTION

Figure 1:
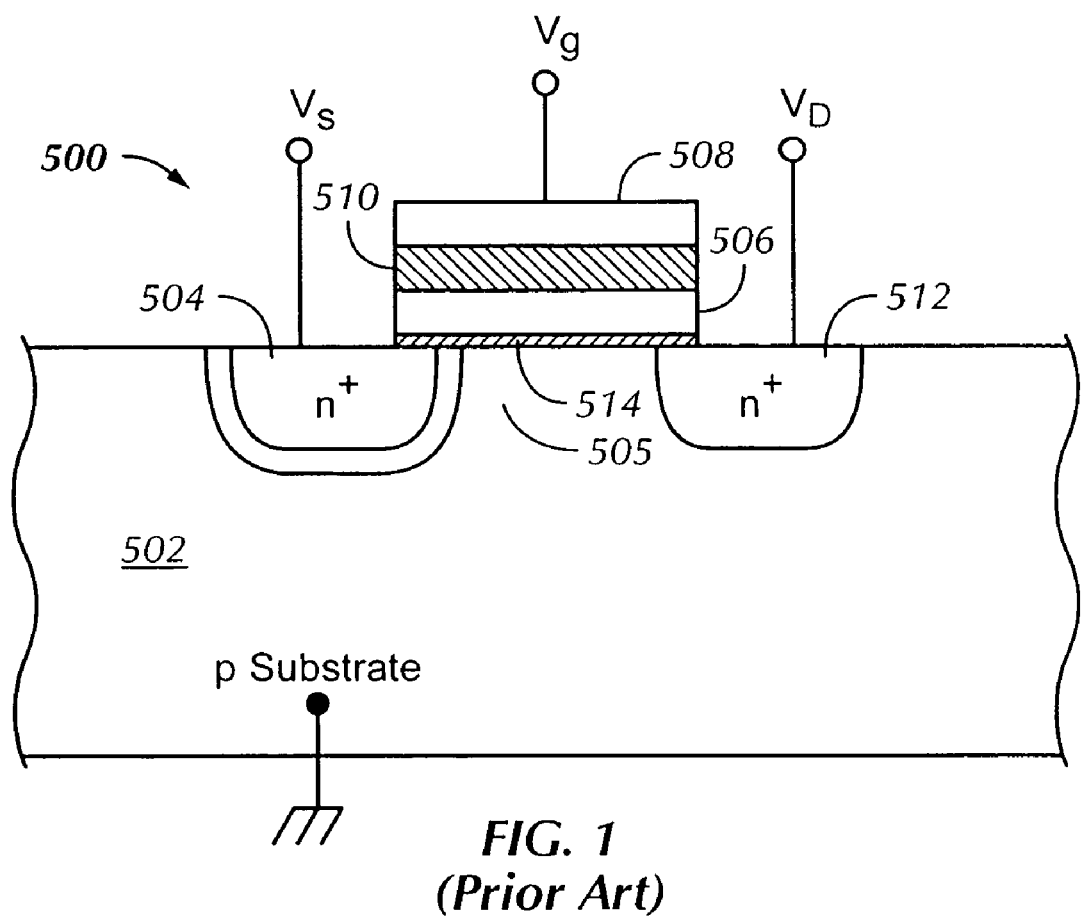
FIG. 1 is a partial elevational cross-sectional view of a prior art flash memory cell.

Certain terminology is used in the following description for convenience only and is not limiting. The words "right", "left", "lower", and "upper" designate directions in the drawing to which reference is made. The words "inwardly" and "outwardly" refer direction toward and away from, respectively, the geometric center of the object described and designated parts thereof. The terminology includes the words above specifically mentioned, derivatives thereof and words of similar import. Additionally, the word "a," as used in the claims and in the corresponding portions of the specification, means "at least one."

As used herein, reference to conductivity will be limited to the embodiment described. However, those skilled in the art know that p-type conductivity can be switched with n-type conductivity and the device would still be functionally correct (i.e., a first or a second conductivity type). Therefore, where used herein, the reference to n or p can also mean that either n and p or p and n can be substituted therefor.

Furthermore, $n^+$ and $p^+$ refer to heavily doped n and p regions, respectively; $n^{++}$ and $p^{++}$ refer to very heavily doped n and p regions, respectively; $n^-$ and $p^-$ refer to lightly doped n and p regions, respectively; and $n^{--}$ and $p^{--}$ refer to very lightly doped n and p regions, respectively. However, such relative doping terms should not be construed as limiting.

Figure 2:
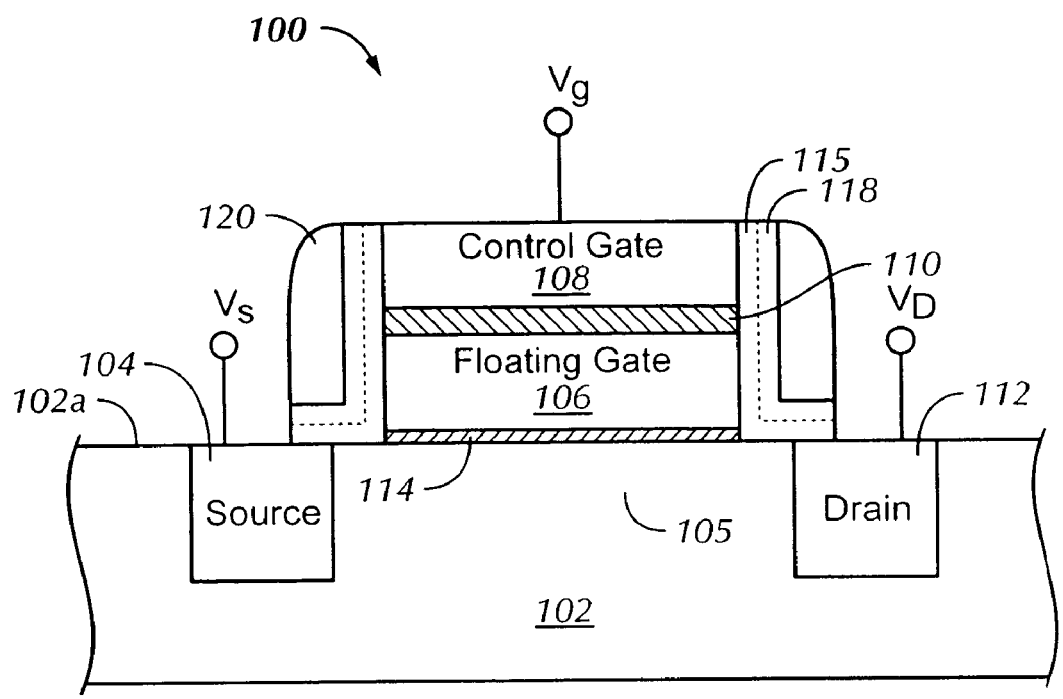
FIG. 2 is a partial elevational cross-sectional view of a flash memory cell having a low-k dielectric spacer in accordance with a first preferred embodiment of the present invention.

Referring to the drawings in detail, wherein like numerals reference indicate like elements throughout, there is shown in FIG. 2 a flash memory cell 100 having a low-k (dielectric value) spacer 120 in accordance with a first preferred embodiment of the present invention. FIG. 2 shows a cross-sectional view of the flash memory cell 100. The flash memory cell 100 includes a source 104, a channel 105, a drain region 112 and a substrate 102. A floating gate 106 is sandwiched between an insulating dielectric layer or inter-gate dielectric layer 110 and a first dielectric layer or thin tunnel oxide layer 114 over the channel 105. The floating gate 106 provides the memory storage element for the flash memory cell 100 and is electrically insulated from other elements of the memory cell 100. Control gate 108 is located on top of the inter-gate dielectric layer 110 and is positioned over the floating gate 106. The floating gate 106 is electrically isolated from the control gate 108 by the inter-gate dielectric layer 110.

The inter-gate dielectric layer 110 is preferably a layer of inter-poly dielectric material. The control gate 108 and the floating gate 106 are preferably formed of doped or undoped polysilicon ($Si_x$).

Similar to the conventional flash memory cell 500, electrical access or coupling to the floating gate 106 takes place only through a capacitor network of surrounding $SiO_2$ layers and source region 104, drain region 112, channel 105 and control gate 108. Any charge present on the floating gate 106 is retained due to the inherent Si—$SiO_2$ energy barrier height, thereby creating a generally non-volatile memory.

The flash memory cell 100 further includes a second dielectric layer 115 surrounding the outer portions of the gates 106, 108 and dielectric layers 110, 114. Preferably, the second dielectric layer 115 is an oxide material. A third dielectric layer 118 is formed over the second dielectric layer 115. Preferably, the third dielectric layer 118 is a nitride material. Further, a low-k dielectric spacer is disposed on top of the third dielectric layer 118 to provide further insulation between the floating gate 106 and the source region 104 and drain region 112. The low-k dielectric spacer layer 120 has a dielectric coefficient value less than that of $SiO_2$ (i.e., less than about 3.9).

The low-k dielectric spacer layer 120 may be fluorinated oxide (FSG), aromatic hydrocarbon (SiLK), fluorocarbon (CF) polymer, porous polymer and the like. Preferably, the low-k dielectric spacer layer 120 is fluorinated oxide. The low-k dielectric spacer layer 120 may be formed by chemical vapor deposition (CVD) for fluorinated oxide and CF polymer or by spin on dielectric (SOD) for aromatic hydrocarbon and porous polymer. The use of low-k material reduces capacitive coupling. By providing such a low-k dielectric spacer layer 120, the capacitance measured between the floating gate 106 and the drain region 112 is reduced. Therefore, the control gate coupling ratio (GCR) can be controlled while the drain coupling ratio (DCR) can be reduced. The use of the low-k dielectric spacer layer 120 can increase the GCR and hence the flash memory cell 100 still has good performance even after a reduction in size. Good reliability can also be achieved because the thickness of the first dielectric (tunnel oxide) layer 114 does not need to be reduced for GCR improvement. On the other hand, the DCR reduction makes the first dielectric (tunnel oxide) layer 114 sustain less stress when the flash memory cell 100 is undergoing programming, and therefore, reliability of he flash memory cell 100 can be improved.

Figure 3:
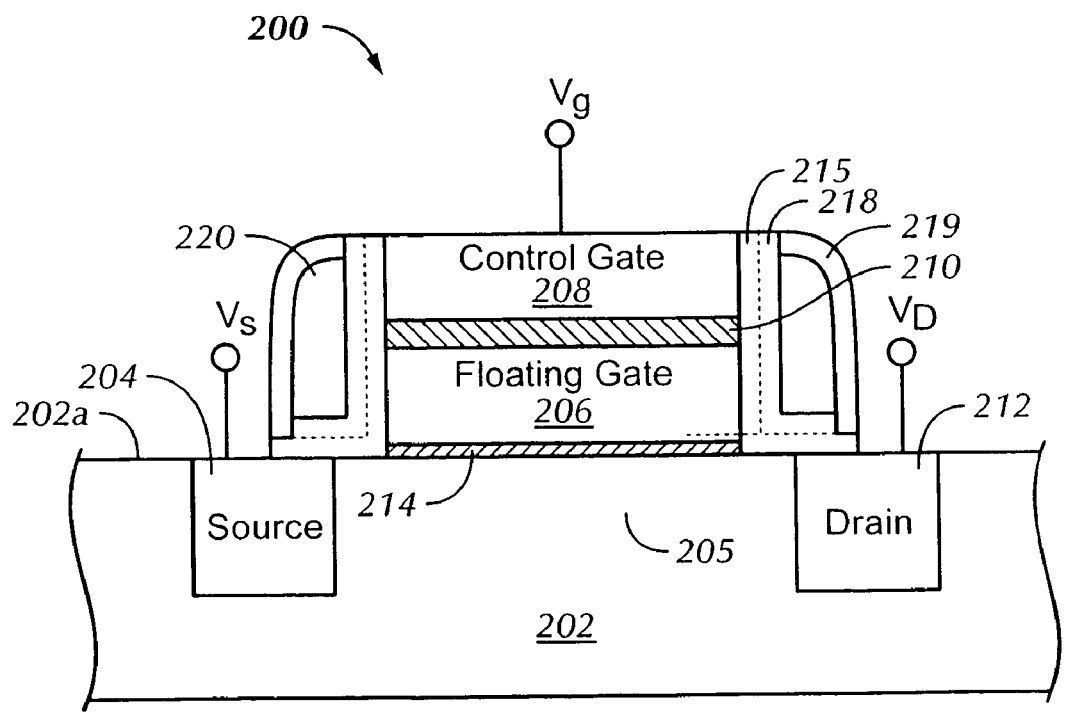
FIG. 3 is a partial elevational cross-sectional view of a flash memory cell having a low-k dielectric spacer in accordance with a second preferred embodiment of the present invention.

FIG. 3 shows a flash memory cell 200 having a low-k dielectric spacer 220 in accordance with a second preferred embodiment of the present invention. FIG. 3 shows a cross-sectional view of the flash memory cell 200. The flash memory cell 200 includes a source region 204, a channel 205, a drain 212 and a substrate 202. A floating gate 206 is sandwiched between an insulating inter-gate dielectric layer 210 and a first dielectric (tunnel oxide) layer 214 over the channel 205. The floating gate 206 provides the memory storage element for the flash memory cell 200 and is electrically insulated from other elements of the memory cell 200. Control gate 208 is located on top of the insulating inter-gate dielectric 210 and is positioned over the floating gate 206. The floating gate 206 is electrically isolated from the control gate by the inter-gate dielectric layer 210.

The inter-gate dielectric layer 210 is preferably a layer of inter-poly dielectric material. The control gate 208 and the floating gate 206 are preferably formed of doped or undoped polysilicon (Si).

Similar to the conventional flash memory cell 500, electrical access or coupling to the floating gate 206 takes place only through a capacitor network of surrounding $SiO_2$ layers and source region 204, drain 212, channel 205 and control gate 208. Any charge present on the floating gate 206 is retained due to the inherent Si—$SiO_2$ energy barrier height, thereby creating a generally non-volatile memory.

Similar to the first preferred embodiment, the flash memory cell 200 further includes a second dielectric layer 215 surrounding the outer portions of the gates 206, 208 and dielectric layers 210, 214. Preferably, the second dielectric layer 215 is an oxide material. A third dielectric layer 218 is formed over the second dielectric layer 215. Preferably, the third dielectric layer 218 is a nitride material. Further, a low-k dielectric spacer 220 is disposed on top of the third dielectric layer 218 to provide further insulation between the floating gate 206 and the source region 204 and drain 212. Additionally, the flash memory cell 200 includes a fourth dielectric layer 219 that surrounds the low-k dielectric spacer layer 220. Preferably, the fourth dielectric layer 219 is a nitride material. The low-k dielectric spacer layer 220 has a dielectric coefficient value less than that of $SiO_2$ (i.e., less than about 3.9).

The low-k dielectric spacer layer 220 may be fluorinated oxide (FSG), aromatic hydrocarbon (SiLK), fluorocarbon (CF) polymer and porous polymer and the like. Preferably, the low-k dielectric spacer layer 220 is fluorinated oxide. The low-k dielectric spacer layer 120 may be formed by chemical vapor deposition (CVD) for fluorinated oxide and CF polymer or by spin on dielectric (SOD) for aromatic hydrocarbon and porous polymer. The use of low-k material reduces capacitive coupling. By providing such a low-k dielectric spacer layer 220, the capacitance measured between the floating gate 206 and the drain 212 is reduced. Therefore, the control gate coupling ratio (GCR) can be controlled while the drain coupling ratio (DCR) can be reduced. The use of the low-k dielectric spacer layer 220 can increase the GCR and hence the flash memory cell 200 still has good performance even after a reduction in size. Good reliability can also be achieved because the thickness of the first dielectric (tunnel oxide) layer 214 does not need to be reduced for GCR improvement. On the other hand, the DCR reduction makes the first dielectric (tunnel oxide) layer 214 sustain less stress when the flash memory cell 200 is undergoing programming, and therefore, reliability of he flash memory cell 200 can be improved.

The layers 110, 114, 115, 118, 120, 210, 214, 215, 218, 219, 220 and gates 106, 108, 206, 208 may be formed in any of a variety of ways known in the art. For example, the layers 110, 114, 115, 118, 120, 210, 214, 215, 218, 219, 220 may be grown or deposited. Deposition may be by chemical vapor deposition (CVD), physical vapor deposition (PVD), evaporation, sputtering and the like. Patterns may be formed on the surface of the semiconductor substrate 102, 202 by photolithography or photomasking ("masking") techniques. Layers 110, 114, 115, 118, 120, 210, 214, 215, 218, 219, 220 may be etched back by mechanical etching, plasma etching, chemical etching and/or chemical mechanical polishing (CMP) and the like. Additionally, known methods of doping, heat treating, diffusing, etching, layering, trenching, polishing and the like, may be utilized in the fabrication process of the flash memory cells 100, 200 without departing from the present invention.

The present invention further includes methods of forming flash memory cells 100, 200, in accordance with the preferred embodiments of the present invention as shown in FIGS. 4-13.

Figure 4:
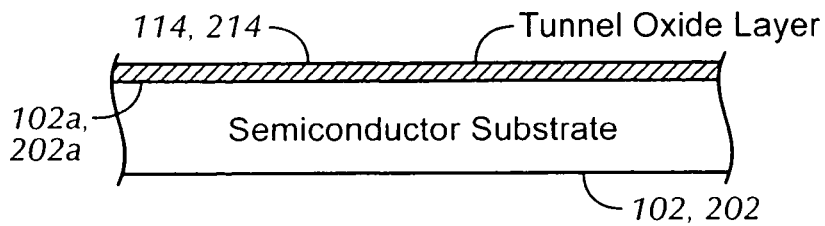
FIG. 4 is a partial elevational cross-sectional view of a semiconductor substrate with a first dielectric layer being formed thereon for forming flash memory cells in accordance with the preferred embodiments.

Referring to FIG. 4, silicon substrate 102, 202 having a main surface 102a, 202a is provided. Preferably, the silicon substrate 102, 202 is a p-type silicon substrate. A first dielectric layer 114, 214 is formed on the main surface 102a, 202a of the substrate 102, 202. The first dielectric layer 114, 214 is applied using one of thermal growth, low pressure (LP) chemical vapor deposition (CVD), plasma enhanced chemical vapor deposition (PECVD), Atmospheric pressure chemical vapor deposition (APCVD), deposition, direct application and combinations thereof.

Figure 5:
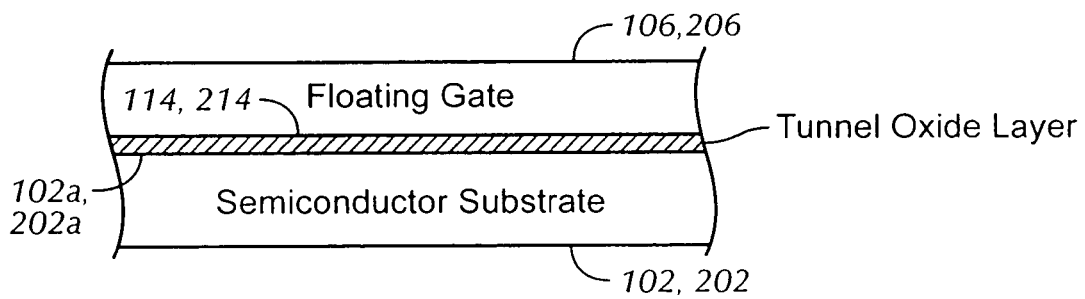
FIG. 5 is a partial elevational cross-sectional view of the partially formed semiconductor device of FIG. 4 having a floating gate layer formed on the dielectric layer.
Figure 6:
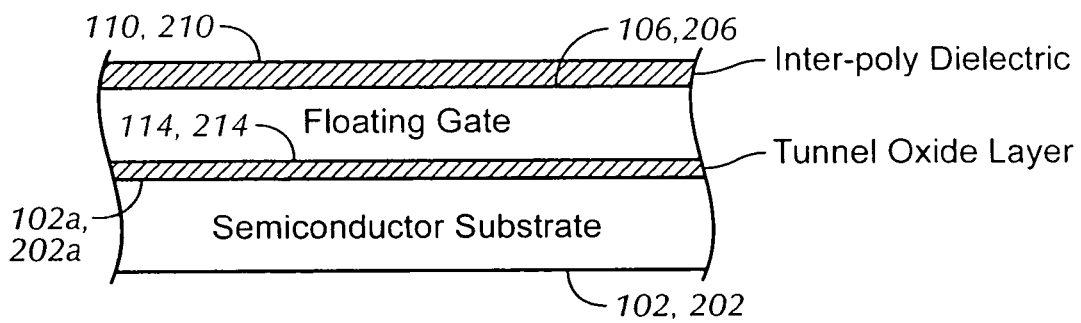
FIG. 6 is a partial elevational cross-sectional view of the partially formed semiconductor device of FIG. 5 having an inter-poly dielectric layer formed on the floating gate layer.
Figure 7:
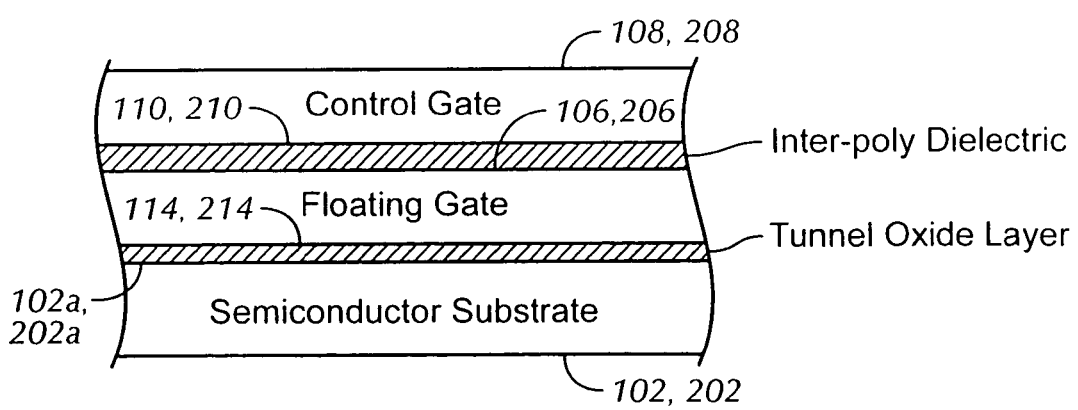
FIG. 7 is a partial elevational cross-sectional view of the partially formed semiconductor device of FIG. 6 having a control gate layer formed on the inter-poly dielectric layer.
Figure 8:
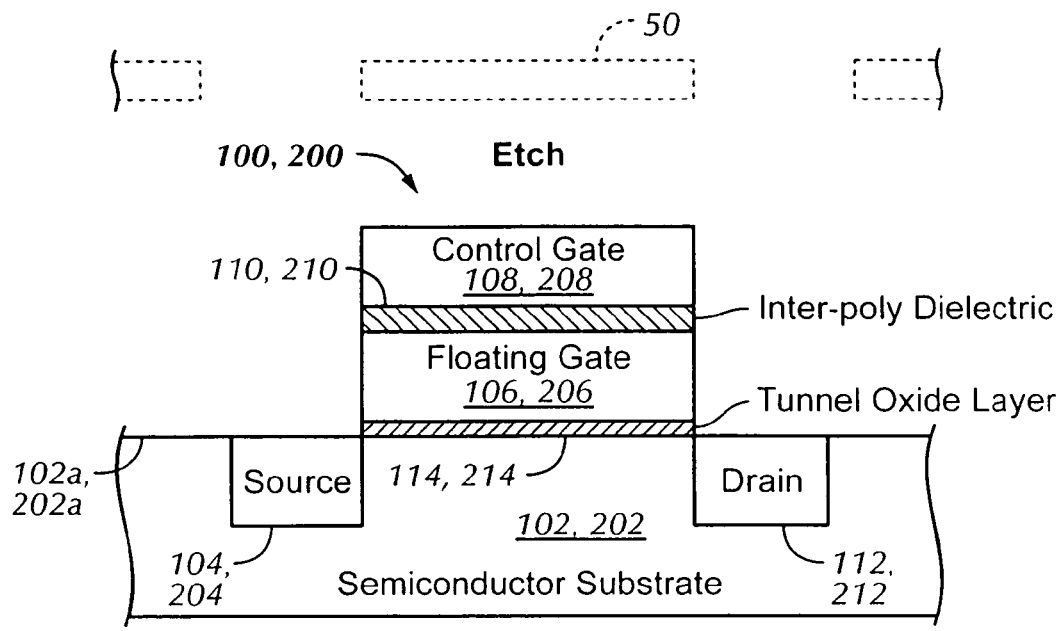
FIG. 8 is a partial elevational cross-sectional view of the partially formed semiconductor device of FIG. 7 during a patterning process.

FIG. 5 shows that the floating gate 106, 206 is formed above the dielectric layer 114, 214, and FIG. 6 shows that an inter-gate dielectric layer 110, 210 is formed above the floating gate 106, 206. The inter-gate dielectric layer 110 is applied using one of thermal growth, LPCVD, PECVD, APCVD, deposition, direct application and combinations thereof Referring to FIG. 7, a control gate 108, 208 is formed above the inter-gate dielectric layer 110, 210. In FIG. 8, a gate mask 50 is placed proximate the main surface 102a, 202a of the silicon substrate 102, 202 during a patterning process. Portions of the control gate 108, 208, the inter-gate dielectric layer 110, 210, the floating gate 106, 206 and the dielectric layer 114, 214 exposed by the gate mask 50 are removed using known etching techniques such as chemical etching, mechanical etching, plasma etching, Reactive Ion Etching (RIE) and the like to form the structure shown in FIG. 8.

Figure 9:
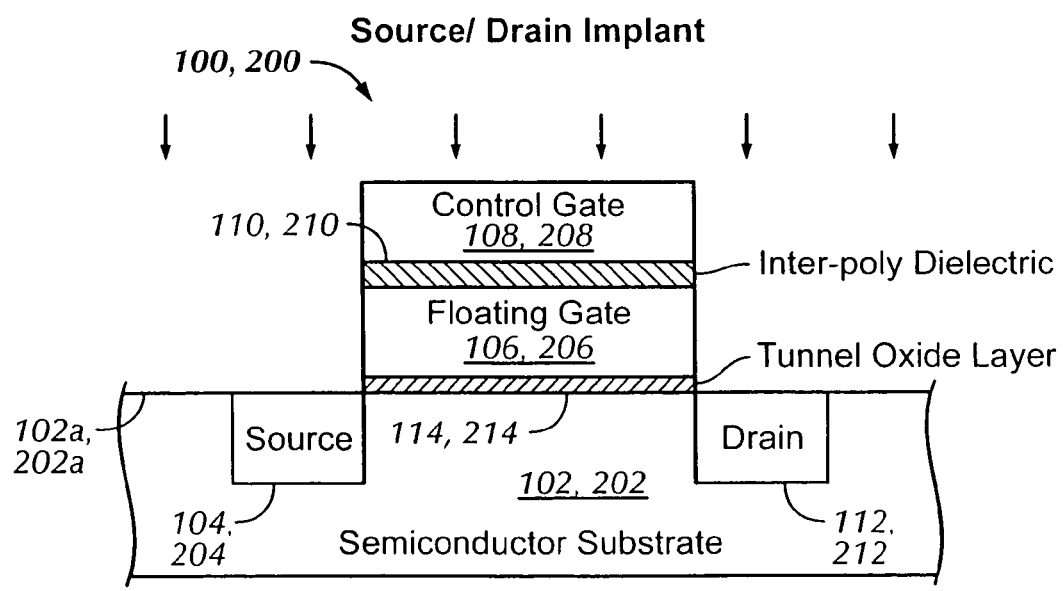
FIG. 9 is a partial elevational cross-sectional view of the partially formed semiconductor device of FIG. 8 during a source/drain implantation process.

FIG. 9 shows that a source region 104, 204 is formed in a portion of the silicon substrate 102, 202 proximate the main surface 102a, 202a. A drain region 112, 212 is also formed in a portion of the silicon substrate 102, 202 proximate the main surface 102a, 202a. The drain 112, 212 is spaced apart from the source region 104, 204. The source region 104, 204 and the drain region 112, 212 may be formed by doping portions of the silicon substrate 102, 202 proximate the main surface 102a, 202a and diffusing the dopants sufficiently into the silicon substrate to create the desired source region 104, 204 and the drain region 112, 212. The doping is performed by one of ion implantation, solid diffusion, liquid diffusion, spin-on deposits, plasma doping, vapor phase doping, laser doping and the like. Doping with boron B results in a more p-type region, doping with phosphorus results in a more n-type region and doping with arsenic Ar results in a more n-type region. Other dopants may be utilized such as antimony Sb, bismuth Bi, aluminum Al, indium In, gallium Ga and the like depending on the material of the substrate 202 and the desired strength of the doping. Preferably, the drain region 112, 212 and the source region 104, 204 are formed by ion implantation. Preferably, the substrate 102, 202 is p-type, the source region 104, 204 is n-type and the drain region 112, 212 is n-type.

Figure 10:
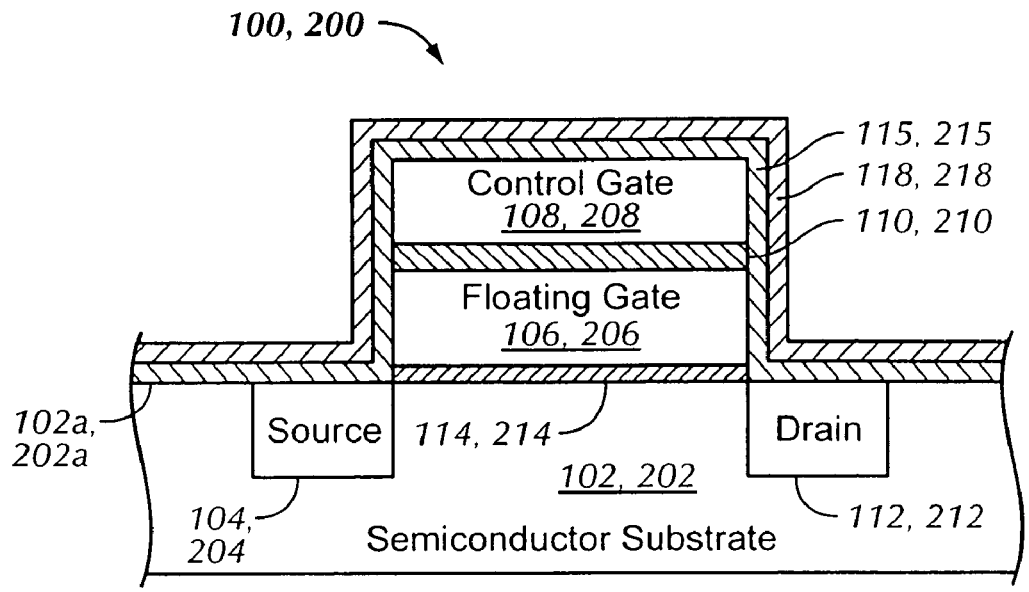
FIG. 10 is a partial elevational cross-sectional view of the partially formed semiconductor device of FIG. 9 having a second dielectric layer and a third dielectric layer formed thereon.

Referring to FIG. 10, a second dielectric layer 115, 215 is formed surrounding outer portions of the dielectric layer 114, 214, the control gate 108, 208, the inter-gate dielectric layer 110, 210 and the floating gate 106, 206. A third dielectric layer 118, 218 may be formed on the second dielectric layer 115, 215 prior to forming the low-k dielectric spacer layer 120, 220.

Figure 11:
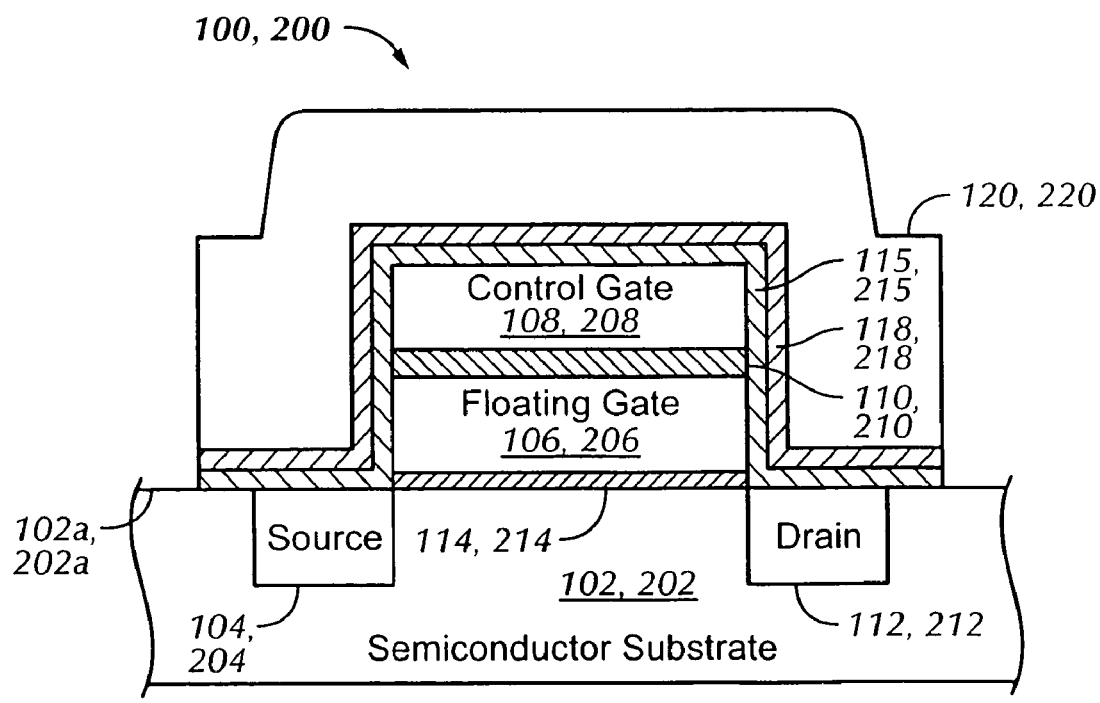
FIG. 11 is a partial elevational cross-sectional view of the partially formed semiconductor device of FIG. 10 having a low-k layer formed on the third dielectric layer.
Figure 12:
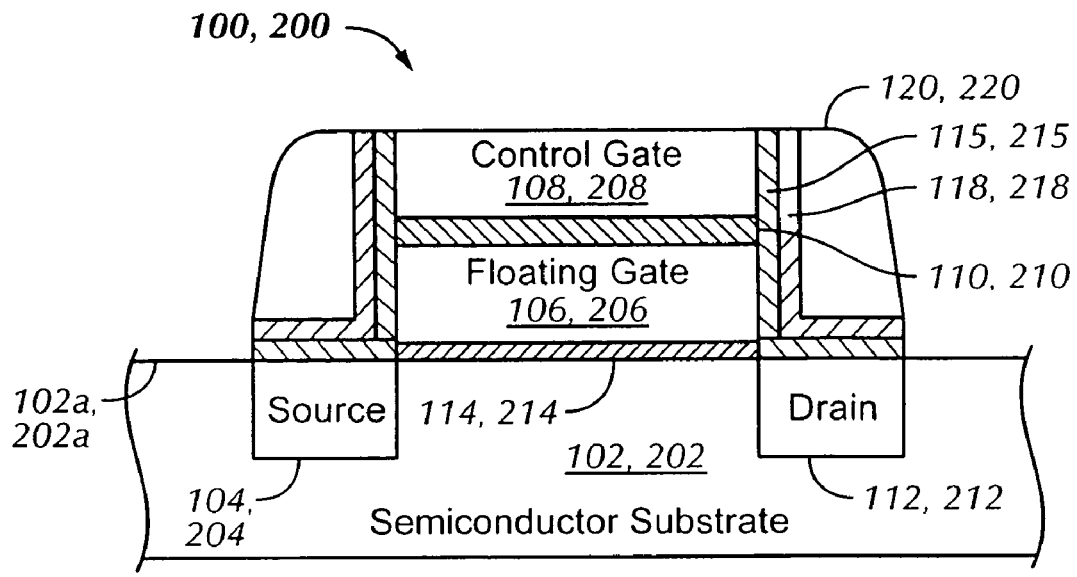
FIG. 12 is a partial elevational cross-sectional view of the partially formed semiconductor device of FIG. 11 during a patterning process.

FIG. 11 shows that the low-k dielectric spacer layer 120, 220 is formed on the third dielectric layer 118, 218. The low-k dielectric spacer layer 120 may be formed by chemical vapor deposition (CVD) for fluorinated oxide and CF polymer or by spin on dielectric (SOD) for aromatic hydrocarbon and porous polymer. In FIG. 12, portions of the low-k spacer layer 120, 220 are removed during a patterning process. The low-k dielectric spacer layer 120, 220 may be fluorinated oxide (FSG), aromatic hydrocarbon (SiLK), fluorocarbon (CF) polymer, porous polymer and the like. Preferably, The low-k dielectric spacer layer 120, 220 has a dielectric coefficient value less than that of undoped $SiO_2$ (i.e., less than about 3.9).

Figure 13:
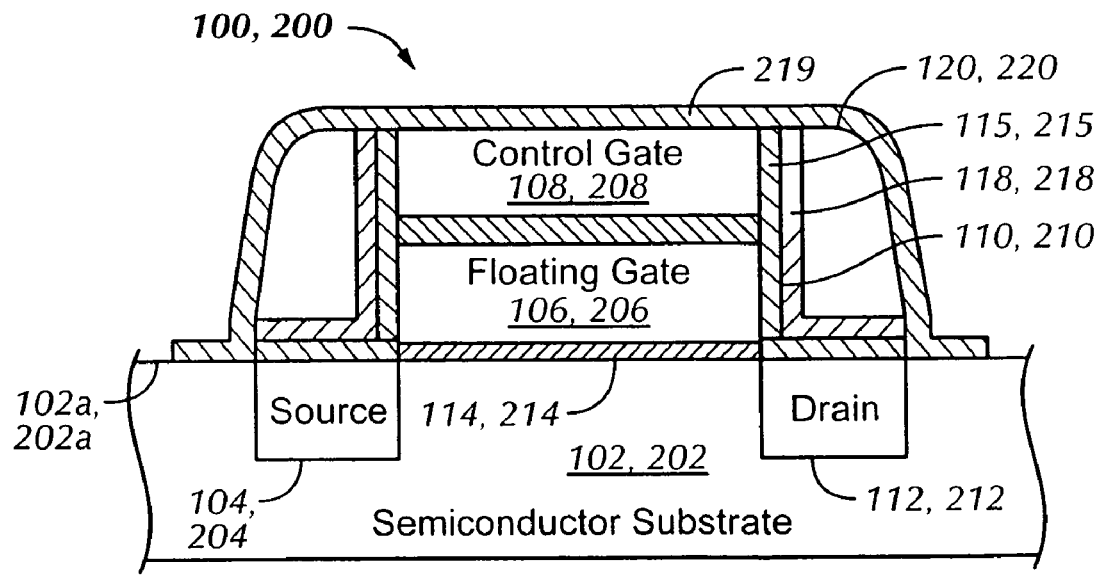
FIG. 13 is a partial elevational cross-sectional view of the partially formed semiconductor device of FIG. 12 having an optional fourth dielectric layer formed thereon.

Optionally, a fourth dielectric layer 219 may be formed on the low-k dielectric spacer 220 (FIG. 13). Preferably, the fourth dielectric layer 219 is a silicon nitride material.

Additional layers may be formed on the flash memory cells 100, 200 and additional connections and metallization may be created as is known in the art without departing from the present invention.

From the foregoing, it can be seen that the present invention is directed to a flash memory device having low-k dielectric spacer and a method for manufacturing a flash memory device having a low-k dielectric spacer. It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A flash memory cell comprising:
   a silicon substrate having a main surface;
   a source region in a portion of the silicon substrate proximate the main surface;
   a drain region in a portion of the silicon substrate proximate the main surface, the drain region being spaced apart from the source region;
   a first dielectric layer formed on the main surface of the substrate, the dielectric layer covering at least a portion of the main surface of the silicon substrate between the source region and the drain region;
   a floating gate disposed above the dielectric layer;
   an inter-gate dielectric layer disposed above the floating gate;
   a control gate disposed above the inter-gate dielectric layer;
   a second dielectric layer surrounding outer portions of the first dielectric layer, the control gate, the inter-gate dielectric layer and the floating gate; and
   a low-k dielectric spacer layer disposed on the second dielectric layer.

2. The flash memory cell according to claim 1, wherein the low-k dielectric spacer layer is one of fluorinated oxide (FSG), aromatic hydrocarbon (SiLK), fluorocarbon (CF) polymer and porous polymer.

3. The flash memory cell according to claim 1, further comprising:
   a third dielectric layer formed on the second dielectric layer and between the second dielectric layer and the low-k dielectric spacer layer.

4. The flash memory cell according to claim 1, further comprising:
   a fourth dilelectric layer formed on the low-k dielectric spacer layer.

5. The flash memory cell according to claim 1, wherein the low-k dielectric spacer layer has a dielectric constant which is less than the dielectric constant of undoped silicon dioxide ($SiO_2$).

6. The flash memory cell according to claim 1, wherein the floating gate is one of doped polysilicon and undoped polysilicon.

7. The flash memory cell according to claim 1, wherein the substrate is p-type, the source region is n-type and the drain region is n-type.

8. The flash memory cell according to claim 1, wherein at least a portion of the silicon substrate proximate to the main surface between the source region and the drain region and underneath the control gate defines a channel region.

* * * * *